United States Patent [19]
Grossman et al.

[11] 3,936,866
[45] Feb. 3, 1976

[54] HEAT CONDUCTIVE MOUNTING AND CONNECTION OF SEMICONDUCTOR CHIPS IN MICRO-CIRCUITRY ON A SUBSTRATE

[75] Inventors: Norman J. Grossman, Malibu; Jacques F. Linder, Palos Verdes Peninsula, both of Calif.

[73] Assignee: Northrop Corporation, Los Angeles, Calif.

[22] Filed: June 14, 1974

[21] Appl. No.: 479,410

[52] U.S. Cl. .................. 357/80; 357/70; 357/81; 174/16 HS
[51] Int. Cl.² .................................... H01L 39/02
[58] Field of Search ............... 357/72, 80, 81, 70; 174/16 HS

[56] References Cited
UNITED STATES PATENTS

| | | | |
|---|---|---|---|
| 3,414,775 | 12/1968 | Melan et al. | 357/80 |
| 3,487,541 | 1/1970 | Boswell | 357/80 |
| 3,568,012 | 3/1971 | Ernst | 357/80 |
| 3,594,619 | 7/1971 | Kamoshida | 357/81 |
| 3,670,404 | 6/1972 | Kamoshida | 357/81 |
| 3,684,818 | 8/1972 | Netherwood | 357/80 |
| 3,805,375 | 4/1974 | Lacombe et al. | 357/72 |
| 3,846,824 | 11/1974 | Bell | 357/81 |

OTHER PUBLICATIONS

Electronics; *Al Gets Around,* p. 38, Dec. 22, 1969.

*Primary Examiner*—Andrew J. James
*Attorney, Agent, or Firm*—William W. Rundle; Willard M. Graham

[57] ABSTRACT

Integrated circuit chips are mounted in electronic assemblies with the chip terminal pads "up" or on the opposite side of the chip from the substrate of the circuit board. The lower chip surface is bonded either directly to the heat-conducting substrate or through an intermediate pedestal of a good heat-conducting volume of metal. Beam leads from the integrated circuit terminals are bonded to relatively large heat-conductive posts acting as spacers, if necessary, between the beam leads and the circuitry pattern.

4 Claims, 7 Drawing Figures

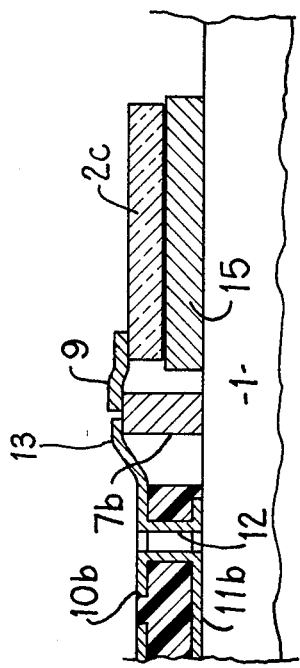
FIG. 5
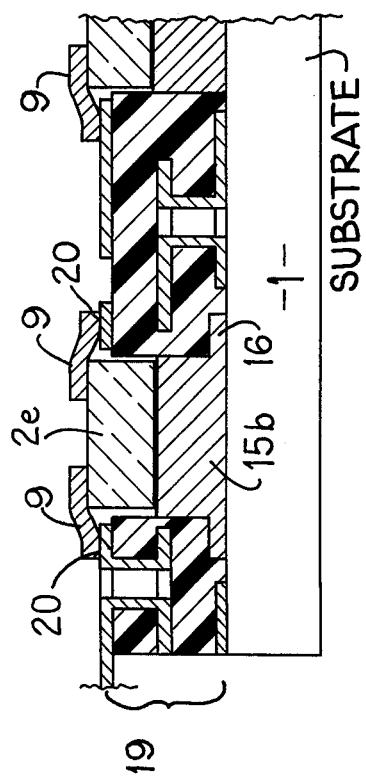
FIG. 7
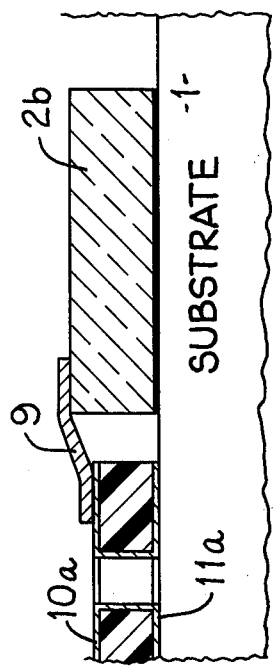
FIG. 4
FIG. 6

HEAT CONDUCTIVE MOUNTING AND CONNECTION OF SEMICONDUCTOR CHIPS IN MICRO-CIRCUITRY ON A SUBSTRATE

The present invention relates to microcircuits, and more particularly, to an improved manner of mounting and connecting beam-leaded integrated circuit chips to their associated circuit board or package.

Beam-leaded integrated circuit (I.C.) chips are conventionally mounted face down on the circuit substrate, with the beam leads bonded to the connection points of the surrounding circuitry. The I.C. chip thus stands away from the substrate and the chip can dissipate the heat it generates only through the beam leads to the substrate. Silicone rubber type compound can be injected into the gap between substrate and chip body to provide some added heat conduction, but this amount is small, generally allowing only about 100 to 200 milliwatts of power to be used in the chip without overheating.

Another drawback to this conventional mounting is that visual troubleshooting of a mounted chip is impossible.

Accordingly, it is an object of the present invention to provide an integrated circuit chip mounting which will allow much higher-power I.C. chips to be used, by providing a greater heat conducting structure.

Another object of this invention is to provide an I.C. chip mounting wherein the beam lead connections to the chip can be inspected and checked.

Still a further object is to provide such an I.C. chip mounting which is adaptable to any arrangement or thickness of the surrounding circuitry on the substrate, and also to various thicknesses of I.C. chips.

Briefly, our invention comprises processing the substrate by standard sheet photo-resist techniques, electroforming and etching using appropriate precision mask tooling to form relatively thick protrusions of heat conductive material either between the substrate and the bottom face of the I.C. chip, or between the substrate and the respective outer ends of the beam leads, or both. The entire bottom face of the I.C. chip is firmly and closely bonded to a protrusion or to the substrate surface itself.

The invention will be more fully understood by reference to the following detailed description of the accompanying drawings.

In the drawings:

FIGS. 3 through 7 are cross-sectional views similar to FIG. 1, showing other arrangements of this invention.

Figure 1:
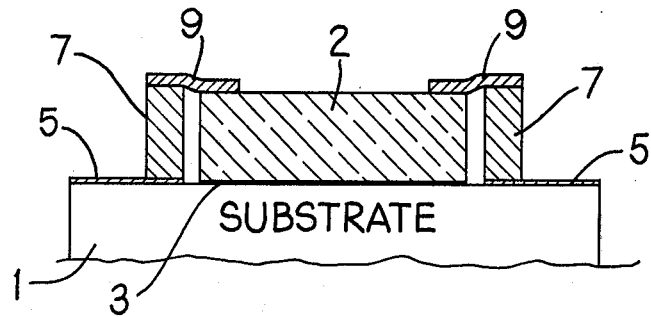
FIG. 1 is a cross-sectional view through an integrated circuit chip attached to its associated circuitry and substrate in accordance with one embodiment of the present invention, not drawn to actual scale.
Figure 2:
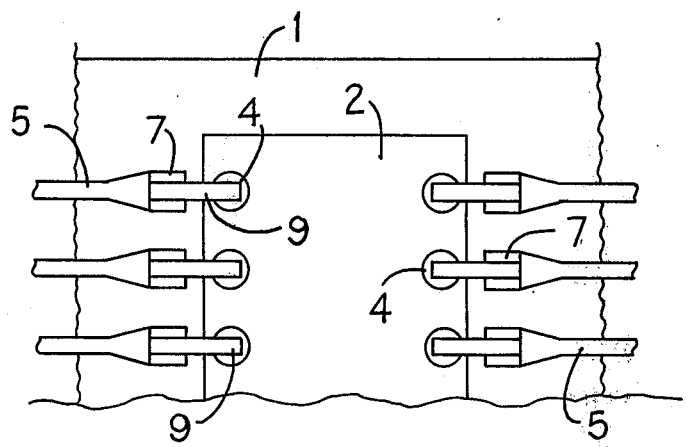
FIG. 2 is a partial top view of the arrangement of FIG. 1.

Referring first to FIGS. 1 and 2, a substrate 1 of alumina or beryllia, for example, is provided as an electrical insulating but heat conducting base on which a circuit assembly is built. This is common practice in the electronic field. Upon the substrate are formed or attached the various circuit elements and conductors. In this case, an integrated circuit chip 2 is mounted "face up" on the substrate 1 and bonded directly thereto such as by an epoxy resin adhesive 3. If the chip 2 is gold-alloyed on the back, solder-bonding or eutectic bonding can be used for maximum thermal conduction.

The face or top surface of the I.C. chip 2 carries the usual terminal pads 4 from the internal elements which are to be connected electrically to surrounding circuitry. This circuitry includes conductive paths 5 formed on the substrate 1 surface by conventional processing, the respective inner ends of these paths 5 being positioned around the I.C. chip 2 in a predetermined pattern in accordance with the chip pad 4 positions.

From the end point of each conductor path 5, a "post" 7 of metal such as copper is fabricated by pattern-electroforming, thus connecting it integrally with the conductor path 5. The height of the post 7 is made comparable to the thickness of the chip 2. The actual size of such a post may be 5 by 5 by 10 mils high, for example. Actually the paths 5 and posts 7 will be formed before the chip 2 is bonded in place. Then, beam leads 9, which may be already bonded to the chip pads 4, are bonded on top of the corresponding posts 7 by any of several known bonding methods. A space of two or three mils may be left between the chip and each post.

The posts 7 will conduct heat from the beam leads 9 to the substrate 1 just as well as if the beam leads were bonded on the conductor paths 5. But now the back of the I.C. chip 2 is bonded to the substrate 1 and conducts heat away from the chip 2 by direct contact.

This illustrates a simple version of the present invention. A definite improvement results from thus placing the I.C. chip 2 in heat conducting relation with the substrate 1, the latter being a heat sink because of its relatively large volume and heat absorbing quality. It is also to be noted that the electrical contact surface of the I.C. chip 2 is accessible for inspection or testing.

Figure 3:
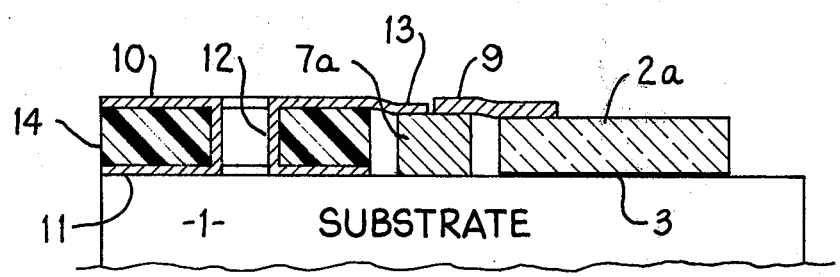

FIG. 3 shows an arrangement similar to FIG. 1. Here, the I.C. chip 2a and beam leads 9 are mounted as described above. The surrounding circuitry on the substrate 1 comprises two layers of conductor metallization 10 and 11 interconnected where desired by plated-through holes 12 in a dielectric board or built-up insulation layer 14. Conductive posts 7a formed directly on the substrate are bonded to flexible extensions 13 of the upper metallization layer 10, and posts 7a are also bonded to the outer ends of the beam leads 9. These posts 7a are preferably wider in the left-to-right direction of the drawing than in the direction perpendicular to the drawing. The height of posts 7a may be made to differ slightly from the height of the face of the I.C. chip 2a so that the beam leads 9 will be bent slightly when both ends are bonded. Since the thicknesses of various types I.C. chips are different, our invention easily accommodates to such variations of types.

In FIG. 4, the chip 2b is bonded to the substrate 1 as described above, but in this arrangement no post is necessary between the beam leads 9 and the respective conductors on the upper metallization layer 10a. This arrangement may be used where chip 2b does not need the same degree of heat dissipation as I.C. chip 2a in FIG. 3.

In the case of another I.C. chip 2c, for example (FIG. 5), another feature of this invention is the provision of a pedestal 15 formed on the substrate 1 in a similiar manner as the posts 7b are formed. The pedestal 15 is of metal such as copper and is made at least as long and wide as the I.C. chip 2c. This chip 2c is bonded to the top of the pedestal 15 the same as the chip 2 is bonded to the substrate 1 in FIGS. 1 through 4. Thus there is the same heat conducting ability in FIG. 5 from the chip 2c through the pedestal 15 and from the beam leads 9 through the posts 7b to the substrate 1 as in the construction of FIG. 3 for example.

While FIG. 5 shows a double layer of conductive metallization 10b and 11b, the structure may require only a single layer 17 as shown in FIG. 6. The posts 7c of this assembly are made higher than posts 7b in FIG. 5, and a pedestal 15a is provided under chip 2d as constructed in FIG. 5. It is obvious that the heat conducting ability of this structure is much greater than in conventional I.C. chip mounting structures.

In more complex, higher density microcircuit construction, the present invention is admirably suited as shown in FIG. 7. Here, three layers of circuit metallization 19 are employed, and a pedestal 15b similar to pedestals 15 and 15a is provided in bonded contact with I.C. chip 2e. Pedestal 15b can have a base flange 16 formed therewith for greater heat transfer. No posts for the beam leads 9 are required in this case, the beam leads 9 being directly bonded to the adjacent circuitry paths at 20 as in common practice. However, posts such as 7b can be provided as in FIG. 5 if even greater heat conduction is required.

It is thus seen that the objects of the present invention are fulfilled by the new heat transmitting structure disclosed herein. Elements such as a power diodes, memory chips, and other high-current carrying devices which formerly had to be mounted separately outside of the integrated circuit package can now be incorporated with the other I.C. circuits in the same single assembly. This structure is adaptable to any situation involving single or multi-layer microcircuits or hybrid circuitry utilizing integrated circuit chip assemblies, as shown by the various arrangements illustrated herein, for example.

Other modifications might also suggest themselves to persons skilled in the art. For instance, it is conceivable that in certain assemblies one or more of the I.C. chip beam leads could be connected respectively to circuit conductor ends immediately on top of the substrate upper surface, while other of the remaining beam leads could be connected to conductors of multi-layer circuitry portions at different heights around the same I.C. chip, thus employing just one or more of the posts 7 of equal or different heights, i.e., less that at all beam leads of a single chip.

While in order to comply with the statue, the invention has been described in language more or less specific as to structural features, it is to be understood that the invention is not limited to the specific features shown, but that the means and construction herein disclosed comprise the preferred form of putting the invention into effect, and the invention is therefore claimed in any of its forms or modifications within the legitimate and valid scope of the appended claims.

What is claimed is:

1. A heat conductive mounting for an integrated circuit chip in an electronic assembly, comprising:
   a. an electrical insulating and heat conducting substrate having a top surface with electrical circuitry thereon for connection to leads from an integrated circuit chip;
   b. an integrated circuit chip having one face with terminal pads thereon, said chip positioned terminal-face up above said top surface of said substrate, beam leads having two ends each, one of said ends connected respectively to said terminal pads, and the other ends of said beam leads extending outwardly beyond said chip;
   c. a solid pedestal of heat conductive metal electroformed directly onto said substrate top surface and bonded continuously to the lower face of said integrated circuit chip opposite said terminal face thereof; and
   d. means electrically bonding said other ends of said beam leads respectively to predetermined portions of said electrical circuitry.

2. Apparatus in accordance with claim 1 wherein said circuitry on said substrate includes electrical conductor ends formed directly on said top surface of said substrate, and wherein said bonding means comprises a solid heat conductive metal post electroformed at one end thereof onto at least one of said electrical conductor ends and directly bonded at its other end to said other end of its respective beam lead.

3. Apparatus in accordance with claim 1 wherein said circuitry on said substrate includes a plurality of layers of circuit metallization having a flexible electrical conductor extension from one of said layers of metallization spaced from said substrate, and wherein said bonding means comprises a solid post of heat conductive metal electro-formed at one end thereof directly onto said top surface of said substrate and bonded at its other end to said conductor extension and also to said other end of one of said beam leads.

4. Apparatus in accordance with claim 1 wherein said circuitry on said substrate includes a plurality of layers of circuit metallization having a conductor end formed on one of said layers of metallization which is spaced from said substrate, and wherein said other end of one of said beam leads is directly bonded to said conductor end, the height of said pedestal being predetermined to make said one beam lead substantially parallel to said substrate.

* * * * *